US012772765B2

(12) United States Patent
Dupre et al.

(10) Patent No.: US 12,772,765 B2
(45) Date of Patent: Oct. 20, 2026

(54) SURFACE TREATMENT METHOD

(71) Applicant: COMMISSARIAT A L'ENERGIE ATOMIQUE ET AUX ENERGIES ALTERNATIVES, Paris (FR)

(72) Inventors: Ludovic Dupre, Grenoble Cedex (FR); Hélène Fournier, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 339 days.

(21) Appl. No.: 18/706,267

(22) PCT Filed: Oct. 20, 2022

(86) PCT No.: PCT/EP2022/079302
§ 371 (c)(1),
(2) Date: Apr. 30, 2024

(87) PCT Pub. No.: WO2023/078692
PCT Pub. Date: May 11, 2023

(65) Prior Publication Data
US 2025/0014905 A1 Jan. 9, 2025

(30) Foreign Application Priority Data
Nov. 2, 2021 (FR) ....................................... 2111606

(51) Int. Cl.
*H01L 21/3065* (2006.01)
*H01L 21/308* (2006.01)
(Continued)

(52) U.S. Cl.
CPC .......... *H10P 50/242* (2026.01); *H10P 50/283* (2026.01); *H10P 50/691* (2026.01)

(58) Field of Classification Search
CPC .... H10P 50/242; H10P 50/283; H10P 50/691; H10P 50/693; H10P 70/50; H10P 70/20
(Continued)

(56) References Cited

U.S. PATENT DOCUMENTS 9,378,950 B1 * 6/2016 Lee .......................... H10P 14/27
2005/0186800 A1 8/2005 Brewer
2020/0381250 A1 * 12/2020 Miyazoe ................. C30B 25/04

FOREIGN PATENT DOCUMENTS

EP 3 608 944 A1 2/2020

OTHER PUBLICATIONS

International Search Report & Written Opinion issued Jan. 26, 2023 in PCT/EP2022/079302 , filed on Oct. 20, 2022, 11 pages.

* cited by examiner

*Primary Examiner* — Tong-Ho Kim
(74) *Attorney, Agent, or Firm* — Oblon, McClelland, Maier & Neustadt, L.L.P.

(57) ABSTRACT

A surface treatment method includes providing a substrate with a surface having areas of selective epitaxy of a first material and masses of matter of the first material; forming a protection layer, produced in a second material, on the surface of the substrate; and forming a flattening layer on the protection layer. Areas of the flattening layer facing the masses of matter and top areas of the protection layer are removed so as to expose the masses of matter. Lateral areas of the protection layer are etched by a selective wet chemical etching. The flattening layer is removed; the masses of matter are etched, the protection layer forming an etch mask; and protection layer is removed.

19 Claims, 3 Drawing Sheets

(51) Int. Cl.

| | |
|---|---|
| ***H01L 21/311*** | (2006.01) |
| ***H10P 50/00*** | (2026.01) |
| ***H10P 50/24*** | (2026.01) |
| ***H10P 50/28*** | (2026.01) |

(58) Field of Classification Search

USPC .......................................................... 438/703

See application file for complete search history.

SURFACE TREATMENT METHOD

TECHNICAL FIELD

The invention relates to the technical field of surface treatment methods.

The invention is notably applicable in the elimination of crystallites that can appear in a selective epitaxy on a substrate (SAG, for "Selective Area Growth").

STATE OF THE ART

One surface treatment method known from the state of the art, called "Etch back", consists in depositing a flattening layer, produced in polymer, on a substrate having a strong surface topography (i.e. not planar), such as a structured surface forming patterns (reliefs). The areas of the flattening layer, facing the top parts of the patterns, are removed by thinning of the flattening layer (e.g. etching) so as to expose the top parts of the patterns. Then, the patterns are removed by a plasma etching.

Such a method of the state of the art is not entirely satisfactory inasmuch as the effectiveness of the plasma etching is greatly dependent:

- on the geometry of the patterns, notably on the inclination of the flanks of the patterns with respect to the normal to the surface of the substrate, and
- on the size disparity of the patterns on the surface of the substrate.

In particular, when the patterns have a bottom part having a lateral extent greater than that of the exposed top part, the plasma etching cannot totally remove the patterns. Indeed, the lateral portions of the bottom part of the patterns, extending beyond the exposed top part, remain after the plasma etching.

SUMMARY OF THE INVENTION

The invention aims to remedy all or part of the above-mentioned drawbacks. To this end, the subject of the invention is a surface treatment method, comprising the steps of:

a) providing a substrate comprising a surface having:
   - areas of selective epitaxy of a first material,
   - masses of matter of the first material, extending between the areas of selective epitaxy;

b) forming a protection layer, produced in a second material, on the surface of the substrate so as to cover the areas of selective epitaxy and the masses of matter;

c) forming a flattening layer on the protection layer;

d) removing areas of the flattening layer facing the masses of matter so as to expose top areas of the protection layer extending over the masses of matter;

e) etching, by a wet chemical etching, the exposed top areas of the protection layer and lateral areas of the protection layer extending at the border of the masses of matter, the wet chemical etching being executed by an etching agent allowing a selective etching of the second material with respect to the first material;

f) removing the flattening layer;

g) etching the masses of matter, the protection layer being adapted to form an etch mask protecting the areas of selective epitaxy;

h) removing the protection layer.

Thus, such a method according to the invention makes it possible to totally eliminate the masses of matter, whatever their geometry (in particular with inclined flanks) and their size disparity. Indeed, the step e) makes it possible, through the wet chemical etching, to clear the borders of the masses of matter by eliminating the lateral areas of the protection layer. This prior clearing of the borders of the masses of matter makes it possible to totally etch the masses of matter in the step g), for example by a plasma etching.

Furthermore, the protection layer makes it possible to protect the areas of selective epitaxy:

(i) in the step e) because the wet chemical etching is executed by an etching agent allowing a selective etching of the second material with respect to the first material, (ii) in the step g) because the protection layer forms an etch mask. In other words, the protection layer allows, in the step g), a selective etching of the first material with respect to the second material.

Also a subject of the invention is a surface treatment method, comprising the steps of:

a) providing a substrate comprising a surface having:
   - areas of selective epitaxy of a first material,
   - masses of matter of the first material, extending between the areas of selective epitaxy;

b) forming a protection layer, produced in a second material, on the surface of the substrate so as to cover the areas of selective epitaxy and the masses of matter;

c) forming a flattening layer on the protection layer;

d') removing areas of the flattening layer facing the masses of matter and top areas of the protection layer extending over the masses of matter, so as to expose the masses of matter;

e') etching, by a wet chemical etching, lateral areas of the protection layer extending at the border of the exposed masses of matter, the wet chemical etching being executed by an etching agent allowing a selective etching of the second material with respect to the first material;

f) removing the flattening layer;

g) etching the masses of matter, the protection layer forming an etch mask protecting the areas of selective epitaxy;

h) removing the protection layer.

Thus, as explained previously, such a method according to the invention makes it possible to totally eliminate the masses of matter, regardless of their geometry (in particular with inclined flanks) and their size disparity. Indeed, the step e') makes it possible, through the wet chemical etching, to clear the borders of the masses of matter by eliminating the lateral areas of the protection layer. This prior clearing of the borders of the masses of matter makes it possible to totally etch the masses of matter in the step g), for example by a plasma etching.

Furthermore, the protection layer makes it possible to protect the areas of selective epitaxy:

(i) in the step e') because the wet chemical etching is executed by an etching agent allowing a selective etching of the second material with respect to the first material, (ii) in the step g) because the protection layer forms an etch mask. In other words, the protection layer allows, in the step g), a selective etching of the first material with respect to the second material.

The step d') differs from the step d) in that the top areas of the protection layer are removed at the same time (i.e. in one and the same etching) as the areas of the flattening layer facing the masses of matter. The step e') differs from the step e) in that only the lateral areas of the protection layer, extending at the border of the masses of matter, are etched by the wet chemical etching.

The method according to the invention can comprise one or more of the following features.

According to a feature of the invention, the flattening layer is produced in a third material; and the step d) is executed by a selective etching of the third material with respect to the second material, the etching being preferably a plasma etching.

Thus, one advantage that is obtained is effectively removing the areas of the flattening layer, facing the masses of matter, so as to expose top areas of the protection layer extending over the masses of matter while keeping the areas of selective epitaxy protected.

According to a feature of the invention, the flattening layer is produced in a third material; and the step d') is executed by an etching:

- that is non-selective between the third material and the second material;
- that is selective of the second material with respect to the first material;
- the etching being preferably a plasma etching.

Thus, one advantage that is obtained is effectively removing the areas of the flattening layer, facing the masses of matter, and the top areas of the protection layer extending over the masses of matter, so as to expose the masses of matter while keeping the areas of selective epitaxy protected.

According to a feature of the invention, the step a) is executed such that the areas of selective epitaxy comprise nanowires.

Thus, one advantage that is obtained is being able to subsequently manufacture nanowire light-emitting diodes.

According to a feature of the invention, the step a) is executed such that the first material is a semiconductor material, preferably a III-V material.

According to a feature of the invention, the step a) is executed such that:

- the first material is a crystalline material;
- the masses of matter are crystallites of the first material.

According to a feature of the invention, the step a) is executed such that:

- the areas of selective epitaxy have a height, denoted $h_1$;
- the masses of matter each have a height greater than 2 $h_1$, preferably lying between 8 $h_1$ and 12 $h_1$.

According to a feature of the invention, the step b) is executed such that the second material is a solid material, preferably chosen from among a dielectric material and a metallic material.

Thus, one advantage that is obtained is forming a hard etch mask in the step g).

According to a feature of the invention, the substrate provided in the step a) is produced in silicon; and the step b) is executed such that the second material is silicon dioxide.

According to a feature of the invention, the protection layer is formed in the step b) by a conformal deposition.

Thus, one advantage that is obtained is following the surface topology of the substrate.

According to a feature of the invention, the flattening layer formed in the step c) is produced in a polymer, preferably a photosensitive polymer.

Thus, one advantage that is obtained is obtaining a flattening layer at low cost, with adjustable thickness, that can easily be deposited on the protection layer (e.g. by spinner).

According to a feature of the invention, the step c) is executed by a deposition by spinner.

According to a feature of the invention, the step g) is executed by a plasma etching.

According to a feature of the invention, the step h) is executed by a wet chemical etching.

Definitions

- "Substrate" is understood to be a self-supporting physical support, produced in a crystalline material from which can be formed, by epitaxy, a device for any type of applications, notably electronic, mechanical or optical. A substrate can be a "slice" (also called "wafer") which generally takes the form of a disk derived from a cut from an ingot of a crystalline material.
- "Areas of selective epitaxy" (or SAG, for "Selective Area Growth") is understood to mean areas of the surface of the substrate, localized, which have undergone an epitaxial growth, while the rest of the surface of the substrate has not undergone epitaxial growth (for example using a growth mask). The expression selective area epitaxy is also used. The localized areas of the surface of the substrate form a crystalline growth seed, from which the first crystalline material can grow. When the first material is different from the material of the substrate, the expression heteroepitaxy applies. When the first material is identical to the material of the substrate, the term homoepitaxy applies.
- "Protection layer" is understood to be a layer adapted to protect the areas of selective epitaxy by allowing a selective etching:
  - (i) of the second material with respect to the first material in the step e) or e'),
  - (ii) of the first material with respect to the second material in the step g). 15
- "Flattening layer" is understood to be a layer adapted to obtain a flat surface topography for the substrate covered by the protection layer. "Flat" is understood to mean a flatness within the usual tolerances linked to the experimental manufacturing conditions, and not a perfect flatness in the mathematical sense of the term. Thus, a flattening layer extending over a structure of strong topography will be slightly corrugated (the corners will be softened and the height differences will be reduced) and not perfectly flat.
- "Expose" is understood to mean that the exposed elements (top areas of the protection layer, masses of matter) have a free surface.
- "Selective etching of a material A with respect to a material B" is understood to mean that the material A can be etched without attacking the material B. In practice, the etching agent is chosen such that the rate of etching of the material A is at least 2 times greater (preferably at least 10 times greater) than that of the material B.
- "Semiconductor" is understood to mean that the material exhibits an electrical conductivity at 300 K lying between $10^{-6}$ S/cm and $10^{3}$ S/cm.
- "III-V material" is understood to be a binary alloy between the elements located respectively in the column III and in the column V of the periodic table of elements.
- "Height" is understood to be a dimension along the normal to the surface of the substrate.
- "Dielectric" is understood to be a material exhibiting an electrical conductivity at 300 K less than $10^{-6}$ S/cm.
- "Conformal deposition" is understood to be a deposition technique (e.g. a physical vapor-phase deposition) of the protection layer that makes it possible to follow the surface topology of the substrate. The rate of conformity (i.e. the ratio between the width of the flanks of the deposited protection layer and the surface thickness of the deposited protection layer) can be between 50% and 100%, preferably lying between 75% and 100%.

BRIEF DESCRIPTION OF THE DRAWINGS

Other features and advantages will become apparent from the detailed explanation of different embodiments of the invention, the explanation being matched with examples and references to the attached drawings.

Figure 1:
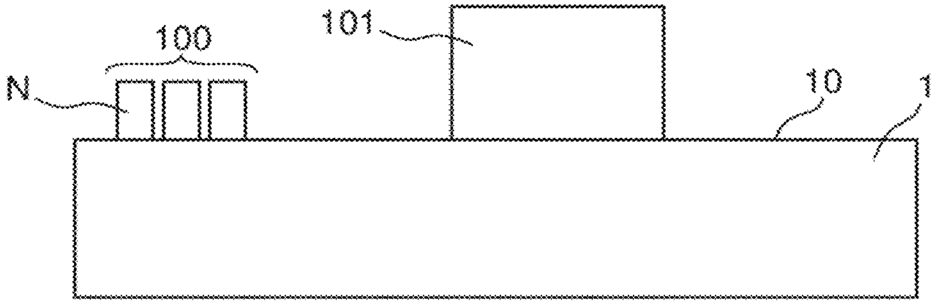
FIG. 1 is a schematic view in cross section, illustrating the step a) of a method according to the invention.

It should be noted that the drawings described above are schematic, and are not necessarily to scale in the interests of legibility and to simplify the understanding thereof. The cross sections are taken along the normal to the surface of the substrate.

DETAILED EXPLANATION OF THE EMBODIMENTS

The elements that are identical or that handle the same function will bear the same references for the different embodiments, in the interests of simplification.

One subject of the invention is a surface treatment method, comprising the steps of:

a) providing a substrate 1 comprising a surface 10 having:
  areas of selective epitaxy 100 of a first material,
  masses of matter 101 of the first material, extending between the areas of selective epitaxy 100;

b) forming a protection layer 2, produced in a second material, on the surface 10 of the substrate 1 so as to cover the areas of selective epitaxy 100 and the masses of matter 101;

c) forming a flattening layer 3 on the protection layer 2;

d) removing areas 3*a* of the flattening layer 3 facing the masses of matter 101 so as to expose top areas 2*a* of the protection layer 2 extending over the masses of matter 101;

e) etching, by a wet chemical etching, the exposed top areas 2*a* of the protection layer 2 and lateral areas 2*b* of the protection layer 2 extending at the border of the masses of matter 101, the wet chemical etching being executed by an etching agent allowing a selective etching of the second material with respect to the first material;

f) removing the flattening layer 3;

g) etching the masses of matter 101, the protection layer 2 being adapted to form an etch mask protecting the areas of selective epitaxy 100;

h) removing the protection layer 2.

One subject of the invention is a surface treatment method, comprising the steps of:

a) providing a substrate 1 comprising a surface 10 having:
  areas of selective epitaxy 100 of a first material,
  masses of matter 101 of the first material, extending between the areas of selective epitaxy 100;

b) forming a protection layer 2, produced in a second material, on the surface 10 of the substrate 1 so as to cover the areas of selective epitaxy 100 and the masses of matter 101;

c) forming a flattening layer 3 on the protection layer 2;

d') removing areas 3*a* of the flattening layer 3 facing the masses of matter 101 and top areas 2*a* of the protection layer 2 extending over the masses of matter 101, so as to expose the masses of matter 101;

e') etching, by a wet chemical etching, lateral areas 2*b* of the protection layer 2 extending at the border of the exposed masses of matter 101, the wet chemical etching being executed by an etching agent allowing a selective etching of the second material with respect to the first material;

f) removing the flattening layer 3;

g) etching the masses of matter 101, the protection layer 2 forming an etch mask protecting the areas of selective epitaxy 100;

h) removing the protection layer 2.

Step a)

The step a) is illustrated in FIG. 1.

The step a) can be executed such that the areas of selective epitaxy 100 comprise nanowires N. The areas of selective epitaxy 100 can have a surface area of the order of a few $mm^2$. The areas extending between the areas of selective epitaxy 100 can have a surface area of the order of a few hundreds of $\mu m^2$.

The step a) can be executed such that:
  the first material is a crystalline material;
  the masses of matter 101 are crystallites of the first material.

The crystallites of the first material can be of various forms: trapezoidal, pyramidal, cylindrical, et cetera.

The step a) can be executed such that the first material is a semiconductor material, preferably a III-V material. By way of nonlimiting examples, the first material can be GaN or InGaN.

The step a) can be executed such that:
  the areas of selective epitaxy 100 have a height, denoted $h_1$;
  the masses of matter 101 each have a height greater than 2 $h_1$, preferably lying between 8 $h_1$ and 12 $h_1$.

As a nonlimiting example, $h_1$ can be of the order of 1 μm and the masses of matter 101 can have a height of the order of 10 μm.

The substrate 1 provided in the step a) can be produced in silicon or in sapphire.

The surface 10 of the substrate 1 can be coated with a growth mask (not illustrated), except on areas of the surface 10 that are intended to form the areas of selective epitaxy 100. If necessary, after the epitaxial growth of the first material, the masses of matter 101 of the first material extend over the growth mask, between the areas of selective epitaxy 100.

Step b)

The second material is different from the first material.

The step b) is advantageously executed such that the second material is a solid material, preferably chosen from among a dielectric material and a metallic material (such as platinum). When the substrate 1 provided in the step a) is produced in silicon or in sapphire, the step b) is advantageously executed such that the second material is silicon dioxide.

The protection layer 2 is advantageously formed in the step b) by a conformal deposition, for example by a plasma-assisted vapor-phase chemical deposition, or PECVD ("Plasma-Enhanced Chemical Vapor Deposition"). The protection layer 2 can have a thickness of 2 μm. As a nonlimiting example, the protection layer 2 can be deposited by a physical vapor-phase deposition.

When there is a growth mask present, the step b) is executed so as to also cover the growth mask.

Step c)

Figures 2A, 2B, 2C, 2D, 2E, 2F:
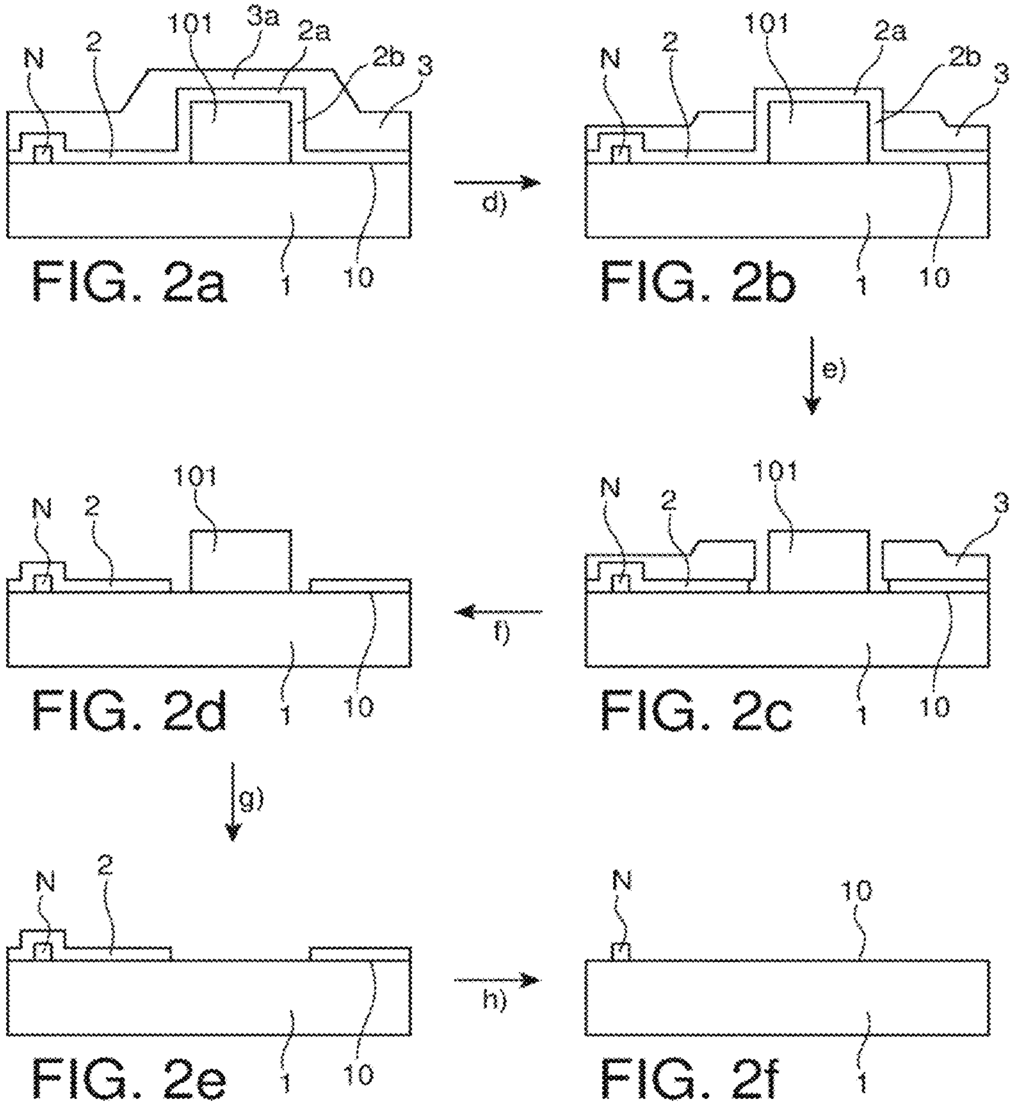
FIGS. 2*a* to 2*f* are schematic views in cross section, illustrating steps of a first method according to the invention.
Figures 3A, 3B, 3C, 3D, 3E, 3F:
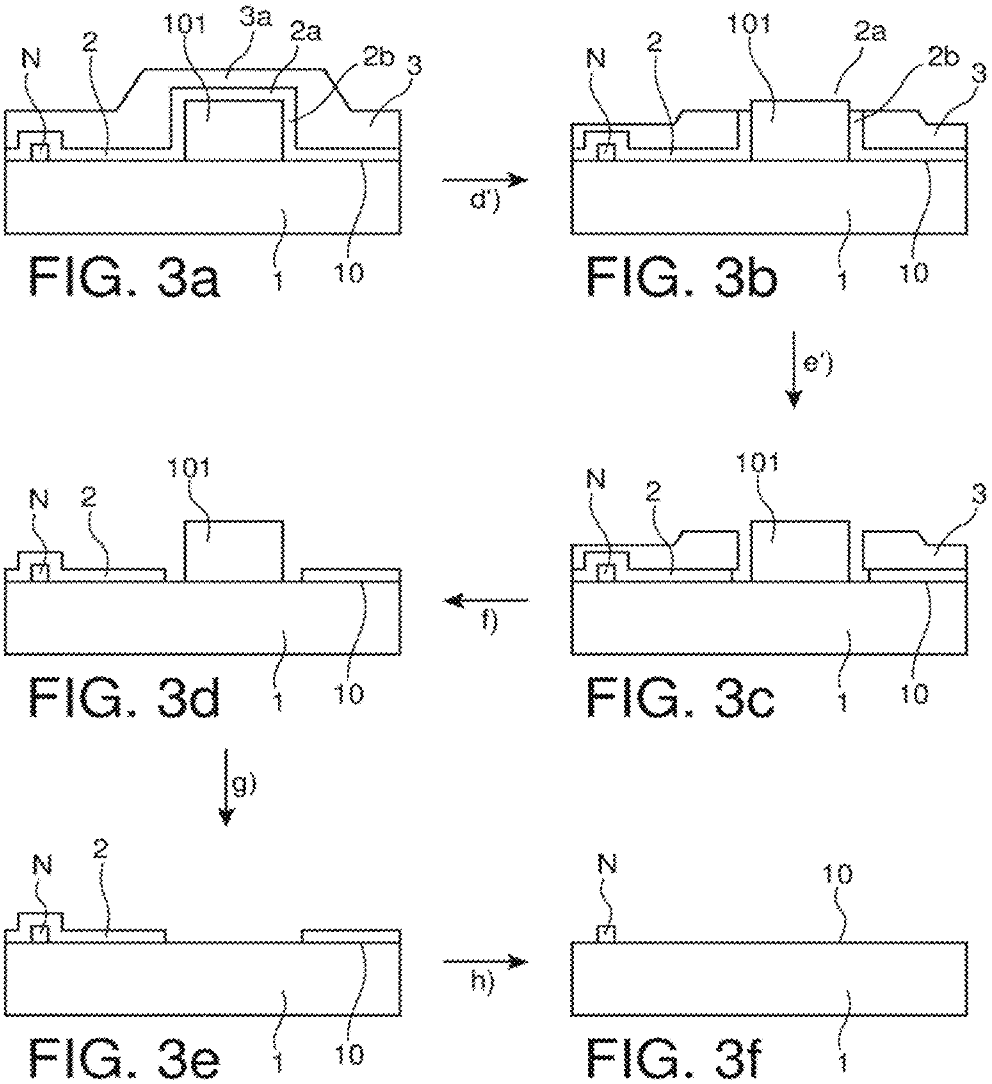
FIGS. 3*a* to 3*f* are schematic views in cross section, illustrating steps of a second method according to the invention.

The situation at the end of the step c) is illustrated in FIGS. 2*a* and 3*a*. The flattening layer 3 formed in the step c) is produced in a third material. The third material is different from the first and second materials. The flattening layer 3 formed in the step c) is advantageously produced in a polymer, preferably a photosensitive polymer (photolithography resin). If appropriate, the step c) is advantageously executed by a deposition by spinner.

Step d)

The step d) is illustrated in FIG. 2*b*.

The step d) can be executed by a thinning of the flattening layer 3, while keeping the areas of selective epitaxy 100 protected.

The step d) is advantageously executed by a selective etching, for example of solid plate type (i.e. an etching not only located on the face of the masses of matter 101), of the third material with respect to the second material, the etching being preferably a plasma etching.

When the first material is GaN, the second material is $SiO_2$, and the third material is a photosensitive resin, the step d) can be executed by an $O_2$ based plasma etching (e.g. reactive ion etching RIE with an inductive coupling plasma ICP).

Step d')

The step d') is illustrated in 3b.

The step d') can be executed by a thinning of the flattening layer 3, while keeping the areas of selective epitaxy 100 protected.

The step d') is advantageously executed by an etching:

- that is non-selective between the third material and the second material;
- that is selective of the second material with respect to the first material;
- the etching being preferably a plasma etching. The etching can be of solid plate type, that is to say an etching not only located on the face of the masses of matter 101.

When the first material is GaN, the second material is $SiO_2$, and the third material is a photosensitive resin, the step d') can be executed by a $CHF_3/O_2$ based plasma etching (e.g. reactive ion etching RIE with an inductive coupling plasma ICP).

Step e)

The step e) is illustrated in FIG. 2*c*.

The etching agent by which the step e) is executed can comprise a hydrofluoric acid solution. The etching agent can be a buffered hydrofluoric acid solution, or BOE (for "Buffered Oxide Etch"), for example when the protection layer 2 is produced in $SiO_2$.

Step e')

The step e') is illustrated in FIG. 3*c*.

The etching agent by which the step e') is executed can comprise a hydrofluoric acid solution. The etching agent can be a buffered hydrofluoric acid solution, or BOE (for "Buffered Oxide Etch"), for example when the protection layer 2 is produced in $SiO_2$.

Step f)

The step f) is illustrated in FIGS. 2*d* and 3*d*.

When the flattening layer 3 is produced in a resin, the step f) can be executed by a resin removal (or "stripping") technique, for example using acetone.

Step g)

The step g) is illustrated in FIGS. 2*e* and 3*e*.

The etching of the step g) is a selective etching of the first material with respect to the second material. The step g) is advantageously executed by a plasma etching. When the first material is GaN and the second material is $SiO_2$, the step g) can be executed by a $Cl_2$ based plasma etching (e.g. reactive ion etching RIE with an inductive coupling plasma ICP).

Step h)

The step h) is illustrated in FIGS. 2*f* and 3*f*.

The step h) can be a selective etching of the second material with respect to the first material. The step h) is advantageously executed by a wet chemical etching, for example using a hydrofluoric acid solution when the first material is GaN and the second material is $SiO_2$.

The invention is not limited to the embodiments explained. The person skilled in the art will be able to consider the technically operative combinations thereof, and substitute equivalents for them.

The invention claimed is:

1. A surface treatment method, comprising the steps of:

a) providing a substrate comprising a surface having:
  - areas of selective epitaxy of a first material, and
  - masses of matter of the first material, extending between the areas of selective epitaxy;

b) forming a protection layer, produced in a second material, on the surface of the substrate so as to cover the areas of selective epitaxy and the masses of matter;

c) forming a flattening layer on the protection layer;

d) removing areas of the flattening layer facing the masses of matter so as to expose top areas of the protection layer extending over the masses of matter;

e) etching, by a wet chemical etching, the exposed top areas of the protection layer and lateral areas (2*b*) of the protection layer extending at a border of the masses of matter, the wet chemical etching being executed by an etching agent allowing a selective etching of the second material with respect to the first material;

f) removing the flattening layer;

g) etching the masses of matter, the protection layer being configured to form an etch mask protecting the areas of selective epitaxy; and h) removing the protection layer.

2. The method as claimed in claim 1, wherein the flattening layer is produced in a third material; and the step d) is executed by a selective etching of the third material with respect to the second material.

3. The method as claimed in claim 1, wherein the step a) is executed such that the areas of selective epitaxy comprise nanowires.

4. The method as claimed in claim 1, wherein the step a) is executed such that the first material is a semiconductor material.

5. The method as claimed in claim 1, wherein the step a) is executed such that:

- the first material is a crystalline material; and
- the masses of matter are crystallites of the first material.

6. The method as claimed in claim 1, wherein the step a) is executed such that:

- the areas of selective epitaxy have a height, denoted $h_1$; and
- the masses of matter each have a height greater than 2 $h_1$.

7. The method as claimed in claim 1, wherein the step b) is executed such that the second material is a solid material.

8. The method as claimed in claim 1, wherein the substrate provided in the step a) is produced in silicon; and the step b) is executed such that the second material is silicon dioxide.

9. The method as claimed in claim 1, wherein the protection layer is formed in the step b) by a conformal deposition.

10. The method as claimed in claim 1, wherein the flattening layer formed in the step c) is produced in a polymer, preferably a photosensitive polymer.

11. The method as claimed in claim 10, wherein the step c) is executed by a deposition using a spinner.

12. The method as claimed in claim 1, wherein the step g) is executed by a plasma etching.

13. The method as claimed in claim 1, wherein the step h) is executed by a wet chemical etching.

14. The method as claimed in claim 1, wherein the step a) is executed such that the first material is a III-V material.

15. The method as claimed in claim 1, wherein the step a) is executed such that:

the areas of selective epitaxy have a height, denoted $h_1$; and the masses of matter each have a height lying between 8 $h_1$ and 12 $h_1$.

16. The method as claimed in claim 1, wherein the step b) is executed such that the second material is chosen from among a dielectric material and a metallic material.

17. The method as claimed in claim 1, wherein the flattening layer formed in the step c) is produced in a photosensitive polymer.

18. A surface treatment method, comprising the steps of:

a) providing a substrate comprising a surface having:

areas of selective epitaxy of a first material, and masses of matter of the first material, extending between the areas of selective epitaxy;

b) forming a protection layer, produced in a second material, on the surface of the substrate so as to cover the areas of selective epitaxy and the masses of matter;

c) forming a flattening layer on the protection layer;

d') removing areas of the flattening layer facing the masses of matter and top areas of the protection layer extending over the masses of matter, so as to expose the masses of matter;

e') etching, by a wet chemical etching, lateral areas of the protection layer extending at a border of the exposed masses of matter, the wet chemical etching being executed by an etching agent allowing a selective etching of the second material with respect to the first material;

f) removing the flattening layer;

g) etching the masses of matter, the protection layer forming an etch mask protecting the areas of selective epitaxy; and h) removing the protection layer.

19. The method as claimed in claim 18, wherein the flattening layer is produced in a third material; and the step d') is executed by an etching:

that is non-selective between the third material and the second material; and that is selective of the second material with respect to the first material.

* * * * *